United States Patent
Yamauchi et al.

(10) Patent No.: US 6,797,926 B2
(45) Date of Patent: Sep. 28, 2004

(54) APPARATUS AND METHOD FOR BONDING ELECTRONIC COMPONENT, CIRCUIT BOARD, AND ELECTRONIC COMPONENT MOUNTING APPARATUS

(75) Inventors: Hiroshi Yamauchi, Katano (JP); Naoto Hosotani, Osaka (JP); Kazuki Fukada, Kadoma (JP); Katsuhiko Watanabe, Moriguchi (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 23 days.

(21) Appl. No.: 10/244,429

(22) Filed: Sep. 17, 2002

(65) Prior Publication Data

US 2003/0080108 A1 May 1, 2003

(30) Foreign Application Priority Data

Sep. 21, 2001 (JP) ........................ 2001-288901

(51) Int. Cl.[7] .................. H05B 3/68; B23K 31/02; H01L 23/12
(52) U.S. Cl. .............................. 219/444.1; 228/180.1; 257/777
(58) Field of Search ................ 219/444.1, 446.1; 228/180.1, 180.21, 180.22, 49.5; 257/777, 779, 782, 783, 784, 621.499, 621.511

(56) References Cited

U.S. PATENT DOCUMENTS

| | | | | |
|---|---|---|---|---|
| 3,562,481 A | * | 2/1971 | West | 219/85.18 |
| 5,528,214 A | * | 6/1996 | Koga et al. | 338/4 |
| 5,667,128 A | * | 9/1997 | Rohde et al. | 228/49.5 |

FOREIGN PATENT DOCUMENTS

JP 2002-151553 5/2002

* cited by examiner

Primary Examiner—Sang Y. Paik
(74) Attorney, Agent, or Firm—Wenderoth, Lind & Ponack, L.L.P.

(57) ABSTRACT

Disclosed are an apparatus and a method for bonding electronic components, a circuit board, and an electronic component mounting apparatus, whereby various kinds of circuit boards can be manufactured, each by a small amount, with high productivity as compared with the conventional art. There are provided a stage member and a heating device, so that a circuit board is heated by the heating device while held in contact with the stage member, which stage member has a size almost equal to that of one circuit board. Generation of losses can be reduced for compact circuit boards, and heating can be performed individually, correspondingly, for each kind of circuit board. Manufacturing various kinds of circuit boards, each by a small amount, with high productivity as compared with the conventional art is enabled accordingly.

26 Claims, 14 Drawing Sheets

APPARATUS AND METHOD FOR BONDING ELECTRONIC COMPONENT, CIRCUIT BOARD, AND ELECTRONIC COMPONENT MOUNTING APPARATUS

TECHNICAL FIELD

The present invention relates to an apparatus and a method for bonding electronic components to a circuit board by using a heating source, a circuit board manufactured by the method, and an electronic component mounting apparatus having a bonder for an electronic component, and more particularly, relates to an apparatus and a method for bonding electronic components so as to manufacture compact and thin circuit boards to be used in compact mobile devices, a circuit board manufactured by the method, and an electronic component mounting apparatus.

BACKGROUND OF THE INVENTION

In a liquid crystal module used for a mobile device or the like, electronic components are mounted to a flexible substrate (FPC) so as to control display of a liquid crystal display part and electrically connect a liquid crystal module to a mother board. To the FPC are mounted a driver IC for the above display control, and chip components such as capacitors, and the like. Since connection parts of the driver IC have narrow pitches, and contamination of the connection parts causes a decrease of reliability of the liquid crystal module, the driver IC is normally mounted before the chip components are mounted.

After the driver IC is mounted, as shown in FIG. 19, solder is supplied onto the FPC by a solder printer 1 and, chip components are mounted onto the FPC by a component mounting machine 2. Then, the FPC is carried into a reflow apparatus 3 having a heat source for melting the solder, whereby the solder is melted and the chip components are bonded to the FPC. In this case, if a circuit board has a thickness of approximately 1 mm and rigidity, the circuit board can be belt transferred by a conveyor. However, in a case of a flexible and film-shaped circuit board, e.g., the above FPC, as shown in FIG. 20, a method is employed in which FPCs 5 are aligned and fixed on a pallet 4, transferred and carried into the reflow apparatus 3. The reflow apparatus 3 at this time is a reflow apparatus which heats an environment in a furnace and then on the pallet 4, causes soldering operations on the FPCs 5 to be performed together.

In producing FPCs 5 of different kinds, each kind of FPC 5 on which components corresponding to each kind are mounted is transferred to the reflow apparatus. But, the reflow apparatus, which heats the environment in the furnace, has poor productivity in this case, and it is more efficient to heat only necessary portions. As such, a reflow apparatus using local heating by providing a light beam system as shown in FIG. 21 is effective. Particularly for preventing light from being applied to other than necessary portions, an arrangement is effective whereby light emitted from a light irradiation part 11 is applied only to the necessary portions through an opening 13 of a mask 12. Reference numeral 6, reference numeral 7 and reference numeral 8 in FIG. 21 indicate a chip component, IC and solder, respectively.

In producing many FPCs 5 of the same kind, productivity is improved by arranging the FPCs 5 on a pallet 4 as large as possible and executing bonding by solder on the FPCs 5 at a single time. However, there is little time in many cases, lately from determining specifications of a circuit board, to produce the circuit board because of a short life of goods, a variety of kinds, complication of design due to sophistication of functions, and fluidity of market trends, and consequently a mass production method by using a large pallet 4 cannot meet enhancing production efficiency requirements.

The production equipment indicated in FIG. 19 is based on a condition of treating large substrates, and therefore each apparatus is itself large. Particularly, the reflow apparatus which heats the environment in the furnace generally has a length of 3–5 m because of uniform heating, and the equipment is too large with respect to a circuit board having a size of approximately 2–30 mm, thereby obstructing flexible measures. The system with the solder printer 1, the component mounting machine 2 and the reflow apparatus 3 shown in FIG. 19 has a total length of as long as, e.g., 7 m.

Although the light beam system is effective in a case of components of the same kind or a small number of components, the number of chip components 6 and the number of kinds of chip components on an FPC 5 tend to increase these days in accordance with an enhanced level of function of the liquid crystal module, and therefore, setting an irradiation condition or the like becomes difficult when there are components having different light absorptances on the FPC 5. For instance, it is possible to manipulate a condition of the mask 12 for black electronic components or electronic components that are to be slightly heated, but there is a limitation imposed on meeting every component by the mask 12 alone because an adjacent solder is half melted or the like.

The present invention is devised to solve the above problems and has for its object to provide an apparatus and a method for bonding electronic components, which enable manufacturing a large number of kinds of circuit boards, each by a small amount, with a higher productivity than in the conventional art, circuit boards manufactured by the method, and an electronic component mounting apparatus having a bonder for an electronic component.

SUMMARY OF THE INVENTION

In order to accomplish the above objective, the present invention is constituted as follows.

A bonder for an electronic component of a first aspect of the present invention comprises:

a stage member for having placed thereon a circuit board to have electronic components mounted thereto; and a heating device for heating the stage member so as to heat the circuit board held in contact with the stage member, and melt a bonding material for bonding the electronic components and the circuit board to each other.

A bonder for an electronic component of a second aspect of the present invention comprises:

a plurality of stage members for having placed thereon a circuit board to have electronic components mounted thereto; and a heating device provided for each of the stage members for heating its stage member so as to heat the circuit board held in contact with this stage member, and melt a bonding material for bonding the electronic components and the circuit board to each other.

In the above first and second aspects, there can be provided a suction device connected to the stage member(s) for sucking and holding the circuit board to the stage member(s).

Also in the first and second aspects, a rear face of each stage member which comes into contact with its respective heating device, and this heating device, can define a space for suction to allow the stage member to be sucked by the suction device.

Further in the first and second aspects, each stage member can have an opening for suction which connects the suction device directly to each stage member.

In the first and second aspects, each stage member can also have a substrate suction hole for sucking a suction region at a stage member contact face of the circuit board held in contact with this stage member, and which connects with the opening for suction.

Yet further in the first and second aspects, there can be provided a member for adhesion to be held between each stage member and its respective heating device for adhering the stage member and the heating device to each other, and a suction device for each stage member which is connected to each heating device for sucking and holding the stage member to its heating device via the member for adhesion by performing a suction operation.

Still in the first and second aspects, an adhesion member contact face of each stage member held in contact with its respective member for adhesion, and this member for adhesion, can define a space for suction to allow the stage member to be sucked by the suction device for the stage member.

In the first and second aspects, each heating device can include a ceramic heater and heat the circuit board by changing a heating temperature with respect to a heating time.

Again in the first and second aspects, there can be provided a cooling device, to be connected to the heating device, for cooling the circuit board.

In an electronic component bonding method according to a third aspect of the present invention, the method comprises:

heating a circuit board that is to have electronic components bonded thereto by a bonding material, with the circuit board being placed on a stage member so as to be in contact therewith, and melting the bonding material by the heating.

A circuit board of a fourth aspect of the present invention is a circuit board having electronic components bonded thereto by performing the electronic component bonding method of the above third aspect.

An electronic component mounting apparatus of a fifth aspect of the present invention comprises the bonder for an electronic component of the first aspect or the second aspect.

According to the bonder for an electronic component of the first and second aspects, the electronic component bonding method of the third aspect and the electronic component mounting apparatus of the fifth aspect of the present invention described above, there are provided the stage member(s) and the heating device(s), wherein the circuit board is brought into contact with the stage member(s) having a size almost equal to a size of one circuit board, and heated by the heating device(s), thus enabling individual heating corresponding to each of various kinds of circuit boards as well as reducing generation of losses with regard to compact circuit boards. Many kinds of circuit boards can be manufactured, each by a small amount, with a higher productivity as compared with the conventional art.

In addition, the suction device for sucking and holding the circuit board to the stage member(s) enables the circuit board to be tightly adhered to the stage member(s), so that a temperature control of the circuit board can be carried out more accurately.

Each stage member has the opening for suction which directly connects to the suction device, thereby preventing bonding material from contaminating the heating device(s) when the bonding material is melted. A cleaning operation for each heating device is eliminated and an availability rate of the bonder for an electronic component can be improved accordingly.

When there are provided the member(s) for adhesion and the suction device for the stage member(s), the stage member(s) can be sucked and held to the heating device(s) by suction action of the suction device for the stage member. Also, when the member(s) for adhesion are arranged, adhesion of the stage member(s) to the heating device(s) can be improved at a time of suction and holding.

When the adhesion member(s)'contact face(s) and the member(s) for adhesion have a space for suction, a suction force of the stage member(s) relative to the heating device(s) can be improved.

When the ceramic heater is used for each heating device, responsiveness to a temperature rise/fall at the heating device can be improved. In consequence, heating by an appropriate temperature control is enabled for each of various kinds of circuit boards. Responsiveness to a temperature change at each heating device can be improved also by including the cooling device, thus enabling heating by an appropriate temperature control for each of various kinds of circuit boards.

Regarding circuit boards having a thickness of not larger than 1 mm, or film-shaped circuit boards, these circuit boards have a good temperature responsiveness to heating control of the heating device. Therefore, heating by an appropriate temperature control is enabled for each of various kinds of circuit boards.

It can be arranged so that one circuit board is heated by a plurality of stage members. A change in size of various kinds of circuit boards can be easily responded to by employing this arrangement, whereby heating by an appropriate temperature control for each of various kinds of circuit boards is enabled.

According to the circuit board of the fourth aspect of the present invention, onto which the electronic components are bonded by the bonder of the first and second aspects, the electronic component bonding method of the third aspect and the electronic component mounting apparatus of the fifth aspect, since heating is performed by an appropriate temperature control corresponding to each kind of board, a bonding state of electronic components can be made uniform for each kind of board.

BRIEF DESCRIPTION OF DRAWINGS

These and other objects and features of the present invention will become apparent from the following description taken in conjunction with preferred embodiments thereof with reference to attached drawings, in which.

DETAILED DESCRIPTION OF THE PREFERRED EMBODIMENTS

Figure 1:
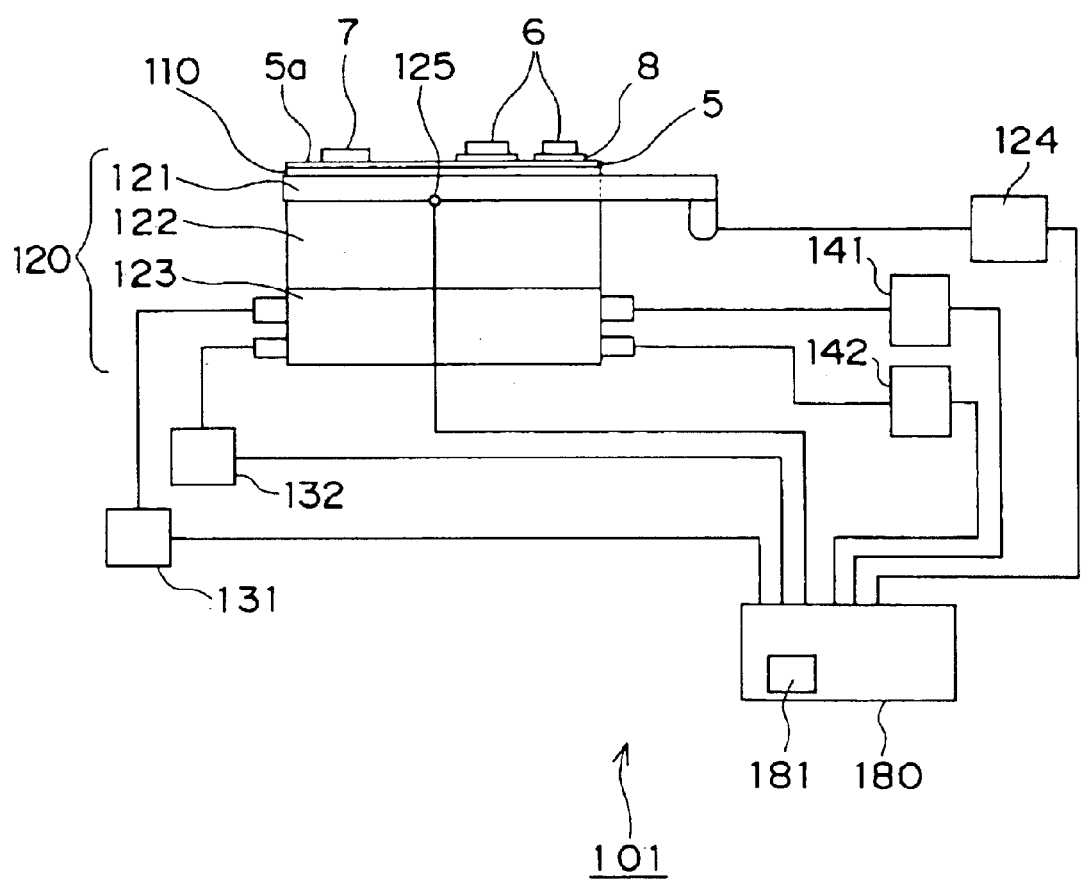
FIG. 1 is a diagram for explaining structure of a bonder for an electronic component according to a first embodiment of the present invention.

An apparatus for bonding electronic components, a method for bonding electronic components, a circuit board, and an electronic component mounting apparatus which are embodiments of the present invention will be described below with reference to the drawings. The method for bonding electronic components is a method performed by a bonder for an electronic component, the circuit board is a substrate to which electronic components are bonded by the electronic component bonding method, and the electronic component mounting apparatus is an apparatus provided with the bonder. The same parts in each of the drawings are designated by the same reference numerals.

In the embodiments below, electronic components are components which are to be surface mounted to a circuit board and are to be bonded to the circuit board by a bonding material, and correspond to, e.g., chip components 6 and an IC 7 shown in FIG. 2. Although a solder, namely, a solder paste is exemplified because of its workability as the bonding material in the following embodiments, the bonding material is not limited to this and can be, for example, a silver paste, a conductive adhesive or the like. Also, while a film-shaped flexible substrate, i.e., FPC is adopted as an example of the circuit board in the following embodiments, the circuit board is not limited to this and may be, e.g., a substrate having a thickness of at most 1 mm. Moreover, it does not matter whether or not the circuit board has flexibility. In other words, the circuit board corresponds to one that is produced in a small amount for every different kind, without being produced in a large amount of the same kind as in the conventional art.

First Embodiment

Figure 2:
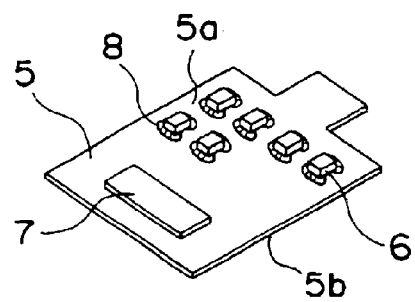
FIG. 2 is a perspective view of a circuit board suitable to be heated by the bonder shown in FIG. 1.

FIGS. 1–4 show a bonder 101 for an electronic component of the present embodiment. FIG. 2 shows FPC 5 which corresponds to a circuit board to be treated by the bonder 101. The FPC 5 is a substrate, for instance, for connecting a liquid crystal module and a motherboard to each other, and is a single-sided mounting substrate. In addition to the IC 7, a plurality of chip components 6 are placed at locations of a component mounting face 5a of the FPC 5 where a solder paste 8, not yet solidified, is applied. In the present embodiment, the IC 7 is already mounted to the FPC 5 before the FPC is sent into the bonder 101.

The bonder 101 has a stage member 110 for having placed thereon the above-described FPC 5, and a heating device 120 for heating the stage member 110 and thereby heating the FPC 5 held in contact with the stage member 110, and for melting the solder paste 8 for bonding electronic components 6 to the FPC 5.

The stage member 110 has both a function of receiving and holding the FPC 5 and a function of transmitting heat to the FPC 5, and is easily replaceable relative to the heating device 120 so as to meet various kinds of circuit boards. The stage member 110 is preferably formed of a material having a good thermal conductivity such as aluminum, copper, magnesium or ceramic, and has a thickness of approximately 0.5 mm–5 mm. Using aluminum material having a thickness of approximately 2 mm is particularly preferable because it is inexpensive and can have equal properties in terms of heat (soaking properties). The stage member 110 is a 35 mm×35 mm square corresponding to a size of the FPC 5 to be treated in the present embodiment.

Figure 3:
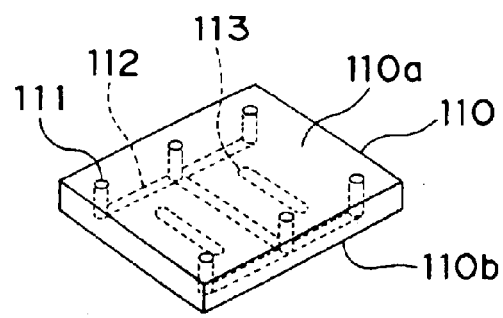
FIG. 3 is a perspective view of a stage member which constitutes a part of the bonder shown in FIG. 1.

Referring further to FIG. 3, suction holes 111 for adhering the FPC 5 are opened to a front face 110a of the stage member 110 to which a rear face 5b, opposite to the component mounting face 5a of the FPC 5, is to be brought into contact. Although there are a plurality of suction holes 111 arranged in the embodiment as indicated in the drawing for adhering a peripheral edge part of the FPC 5, the number and position of the suction holes 111 are determined in correspondence to a circuit board to be held. Moreover, the suction holes 111 are connected to each other by suction grooves 112 for the substrate. In addition, suction grooves 113 for the stage member are arranged on a rear face 110b, opposite to a front face 110a of the stage member 110, for tightly adhering the stage member 110 itself to a heater part 121 to be described later.

The heating device 120 has the heater part 121, a thermal insulating part 122, a base part 123 and a power supply part 124. The thermal insulating part 122 and the heater part 121 are stacked in this order onto the base part 123, and the stage member 110 is arranged on the heater part 121.

The heater part 121 is comprised of a so-called ceramic heater, which is heated when a current is supplied from the power supply part 124 to a heater wire of the ceramic heater. In a case of a heater other than a ceramic heater, namely, a constant heating heater, responsiveness to a temperature rise/drop is required to be several tens of seconds to several minutes, which is poorly productive and impractical. On the other hand, the ceramic heater can respond even within one second or shorter, thereby enabling setting a temperature profile as will be described below.

Figure 4:
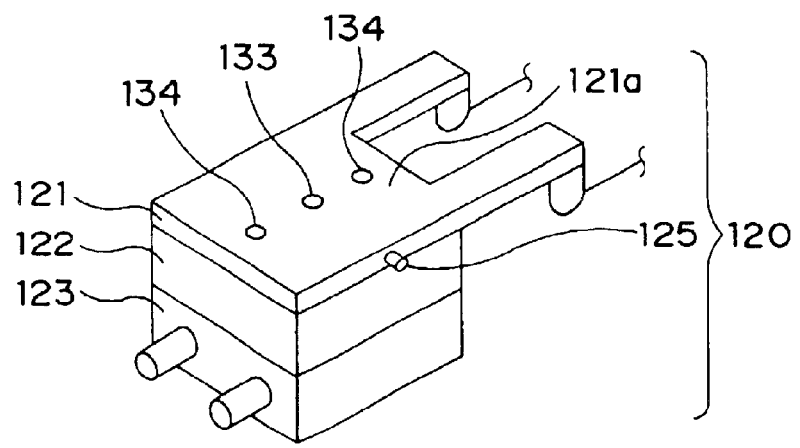
FIG. 4 is a perspective view of a heating device which constitutes a part of the bonder shown in FIG. 1.

A temperature of the heater part 121 is measured by a temperature sensor, for example, a thermocouple 125 disposed inside the heater part 121, and is sent to a controller 180. The power supply part 124 is connected to the controller 180. The controller 180 feedback controls the temperature of the heater part 121 on the basis of temperature information supplied from the thermocouple 125 and a preliminarily set temperature profile for controlling a temperature of the circuit board. As shown in FIG. 4, to a stage member set face 121a of the heater part 121, there are opened a hole 133, for adhering the circuit board, to communicate with suction grooves 112 arranged in the stage member 110, and moreover, holes 134, for adhering the stage member, to communicate with the suction grooves 113 formed in the stage member 110. A space for suction is defined by the suction grooves 113 and the holes 134.

The thermal insulating part 122 is for efficiently transmitting heat of the heater part 121 to the FPC 5, and is fixed to the base part 123.

To the base part 123 are connected a suction device 131, for the circuit board, for adhering the FPC 5 to the stage member 110, and a suction device 132, for the stage member, for adhering the stage member 110 to the heater part 121. The suction device 131 is connected to the hole 133 of the heater part 121 to suck and hold the circuit board, i.e., the FPC 5 in this example, to the front face 110a of the stage member 110 via the suction grooves 112 and the suction holes 111 through a suction operation of the suction device 131. The suction device 132 is connected to the holes 134 of the heater part 121 to suck and hold the stage member 110 to the stage member set face 121a of the heater part 121 through a suction operation of the suction device 132. Although the FPC 5 and the stage member 110 are sucked and held by separate suction devices 131 and 132, respectively, in the present embodiment as described hereinabove, both may be sucked and held by one suction device.

Further, a cooling device 141 for the heater part 121 is connected to the base part 123 so that the heater part can be forcibly cooled in order to perform a temperature control conforming to the above temperature profile. In this embodiment, the cooling device 141 forcibly cools the heater part 121 by supplying a gas, e.g., air to an upper face or a lower face of the heater part 121. While the thermal insulating part 122 is arranged at a lower part of the heater part 121, a cooling device 142, for the base part, for cooling the base part 123 is connected to the base part 123 to prevent the base part 123 from being heated by a continuous heating operation. The cooling device 142 alike supplies a gas, for example, air in the embodiment.

Each of the suction device 131 for the circuit board, the suction device 132 for the stage member, the cooling device 141 for the heater part and the cooling device 142 for the base part is connected to the controller 180 and controlled in operation.

Figure 5:
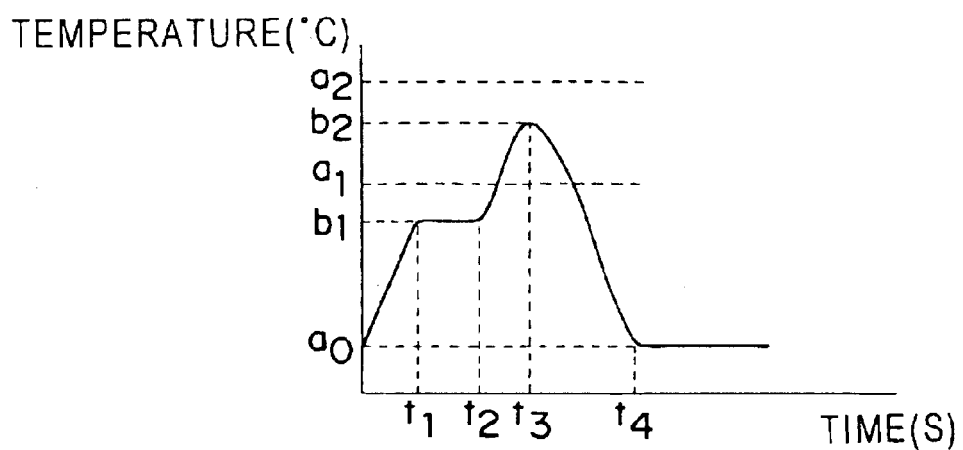
FIG. 5 is a graph showing an example of a temperature profile used for temperature control performed by the bonder shown in FIG. 1.
Figure 6:
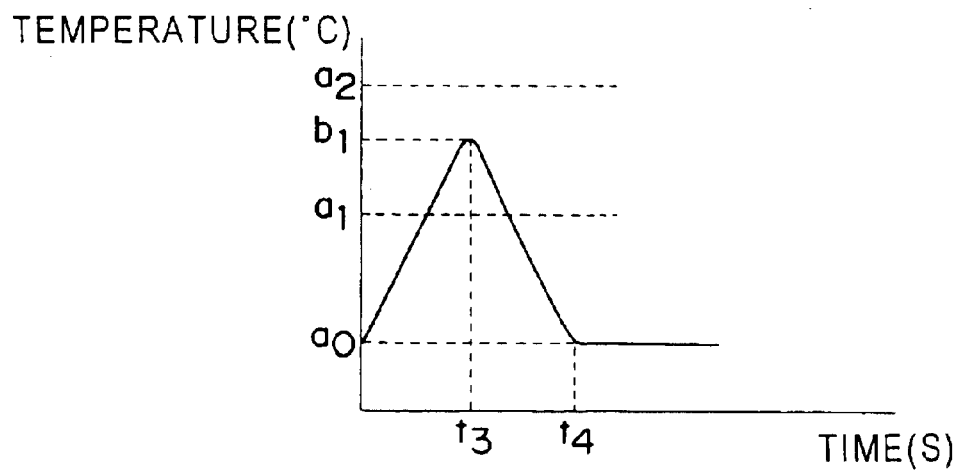
FIG. 6 is a graph showing another example of a temperature profile used for temperature control performed by the bonder shown in FIG. 1.
Figure 7:
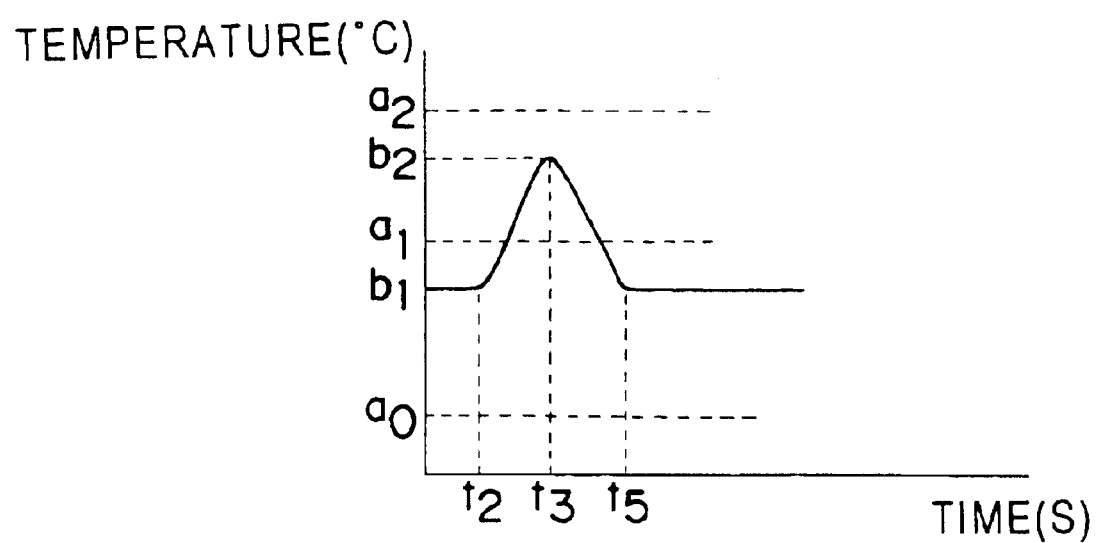
FIG. 7 is a graph showing a still different example of a temperature profile used for temperature control performed by the bonder shown in FIG. 1.

For the above temperature profile, for instance, such forms as shown in FIGS. 5–7 can be considered. An optimum temperature profile is selected in accordance with each of parameters, e.g., a type of bonding material, a type and number of electronic components to be bonded onto a circuit board, and a material, a thickness, and the like of the circuit board. As a selection method, a method conceivable by those skilled in the art can be employed, such as a method of storing each kind of temperature profile corresponding to each of the above parameters in a storage part 181 in the controller 180, and automatically extracting the optimum temperature profile by the controller 180 by inputting information related to the circuit board and electronic components to be treated, or a method of inputting a temperature profile selected by a worker, or the like.

By way of example, in FIGS. 5–7, a0 represents a room temperature, a1 represents a melting point of bonding material, which is a eutectic solder in the embodiment, and therefore 183° C., a2 represents 230° C., b1 represents 150° C., b2 represents 220° C., t1 represents one second, t2 represents three seconds, t3 represents four seconds, t4 represents ten seconds, and t5 represents six seconds.

In a case particularly where electronic components 6 and 7 have a limitation to heating, a heating temperature can be set to not higher than the above a2 as an upper limit of the heating temperature. Since the FPC 5 is heated only from the rear face 5b where components are not mounted, the electronic components 6 and 7 are heated eventually. Setting the heating temperature as above is effective also from this point of view if in the presence of the above heating limitation.

When it is necessary to suppress generation of a solder ball at a melting time of the solder, as shown in FIG. 5, it is preferable to set a preheating operation of maintaining the same temperature from a time point t1 to a time point t2. On the other hand, if an effect of a solder ball is negligible because electronic components are relatively large, as shown in FIG. 6, the solder may be melted at a time without setting the above preheating operation. Meanwhile, if it is desired to shorten a time required for melting the solder and bonding electronic components to a circuit board, as shown in FIG. 7, a method is possible in which a heating operation is started preliminarily from preheating temperature b1, and the temperature b1 is maintained even after completion of solder bonding.

With respect to the above-constituted bonder t 101, an operation of the bonder 101, that is, an electronic component bonding method will be described below. The electronic component bonding method, in other words a reflow method, is a method particularly effective for thin circuits boards, preferably for substrates having a thickness of not larger than 1 mm as a standard. Especially as in the present embodiment, the method is more effective for film-shaped circuit boards, i.e., the above FPC 5 because of its good follow-up performance to a temperature control. As a material of the circuit boards, a glass fabric based epoxy resin or a paper based phenolic resin is preferred for the 1 mm thick or thinner circuit boards, and polyimide is preferably used for the film-shaped circuit boards, because such material has both a strength and a heat resistance in spite of a considerably small thickness of approximately 0.01–0.1 mm.

First, the stage member 110 having the suction holes 111 arranged correspondingly to a circuit board, i.e., the FPC 5 in the embodiment, is placed on the stage member set face 121a of the heater part 121. The suction device 132 for the stage member is activated, thereby sucking the stage member 110 via the holes 134 which are opened to the heater part 121, and tightly adhering and fixing the stage member 110 to the heater part 121. Then, after the suction device 131 for the circuit board is activated, the FPC 5 is placed on the front face 110a of the stage member 110, and the FPC 5 is adhered and fixed to the front face 110a via the hole 133 of the heater part 121 and the suction holes 111 of the stage member 110. As a result, the stage member 110 is tightly adhered and fixed to the heater part 121, and moreover, the FPC 5 is tightly adhered and retained tracing the front face 110a of the stage member 110, so that heat of the heater part 121 is efficiently transmitted to the FPC 5. A heating operation of the heater part 121 is controlled by the controller 180 according to the above-described temperature profile, whereby solder 8 is melted and electronic components 6 are bonded onto the FPC 5 by the solder. After bonding, operation of the suction device 131 is stopped to stop suction and the FPC 5 is separated from the stage member 110.

According to the bonder 101, one circuit board to be heated is heated by the heating device 120 while the circuit board is kept in contact with the stage member 110 having a size nearly equal to the size of the circuit board. Therefore, generation of losses associated with small circuit boards can be reduced, and at the same time, heating can be performed individually, correspondingly, for each kind of circuit board. It becomes possible to manufacture various kinds of circuit boards, each by a small amount, with a higher productivity as compared with the conventional art.

Since a circuit board to be heated is heated by the heating device 120 while being held in contact with the stage member 110 that is nearly equal in size to that of the circuit board, a reflow apparatus of an ambience circulation type as in the conventional art is eliminated. It is possible to constitute each bonder 101 of a size of, e.g., 35 mm×35 mm for FPC 5 having a size of, e.g., 35 mm×35 mm. A considerably compact apparatus for heating and bonding circuit boards, as compared with the conventional art, is provided accordingly.

Figure 8:
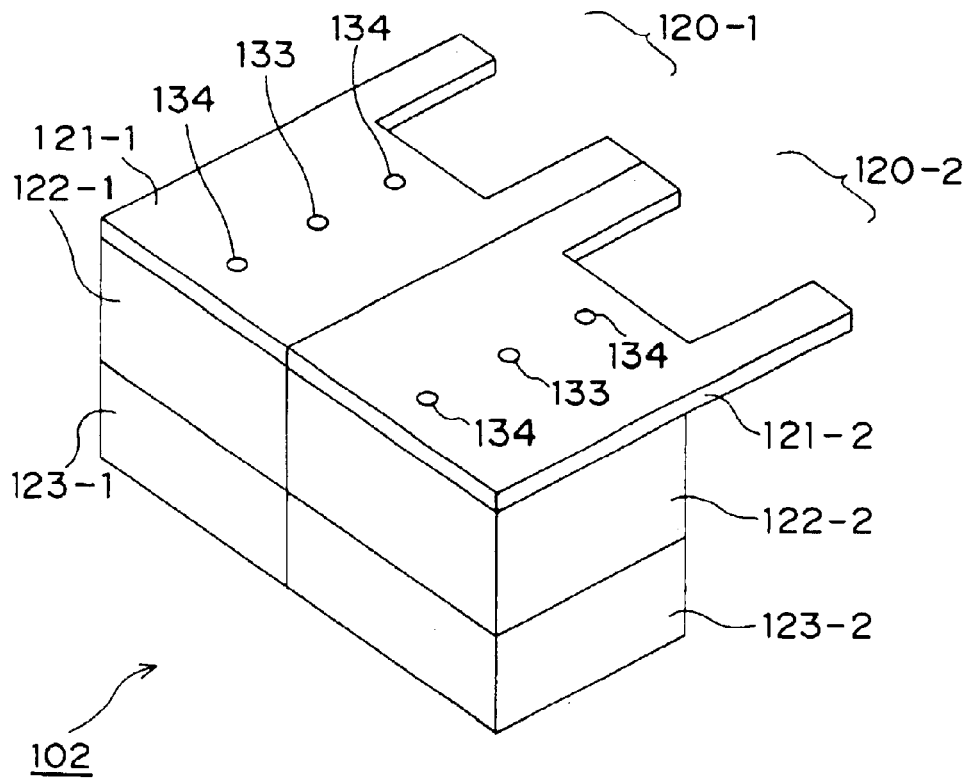
FIG. 8 is a perspective view of a modified example of the bonder shown in FIG. 1.

In the bonder 101 of the above-discussed embodiment, one FPC 5 is placed on the front face 110a of the stage member 110 which has a size equal to or slightly larger than that of the FPC 5. However, the size of the circuit board relative to the stage member 110 is not limited to this example of the embodiment. For instance, a plurality of bonders 101 can be arranged side by side in a lateral direction like a bonder 102 for an electronic component as shown in FIG. 8, and one circuit board may be placed on a plurality of stage members 110. An arrangement direction is not limited to a lateral direction and can be a longitudinal direction, or furthermore, both longitudinal and lateral directions. Also, a plurality of FPCs 5 may be placed on the front face 110a of one stage member 110.

By constituting as above, the bonder 101 of the present embodiment becomes applicable irrespective of the size of circuit boards. The above structure of a parallel arrangement is an effective measure when it is taken into account that a large ceramic heater itself is rare at present, and development costs for a large ceramic heater is enormous.

By adopting the above structure of the parallel arrangement, it also becomes possible to perform one heating control for an entire range of a heating region at one circuit board, or perform mutually different heating controls for a plurality of areas in a heating region of one circuit board. More versatility can be provided.

Figure 9:
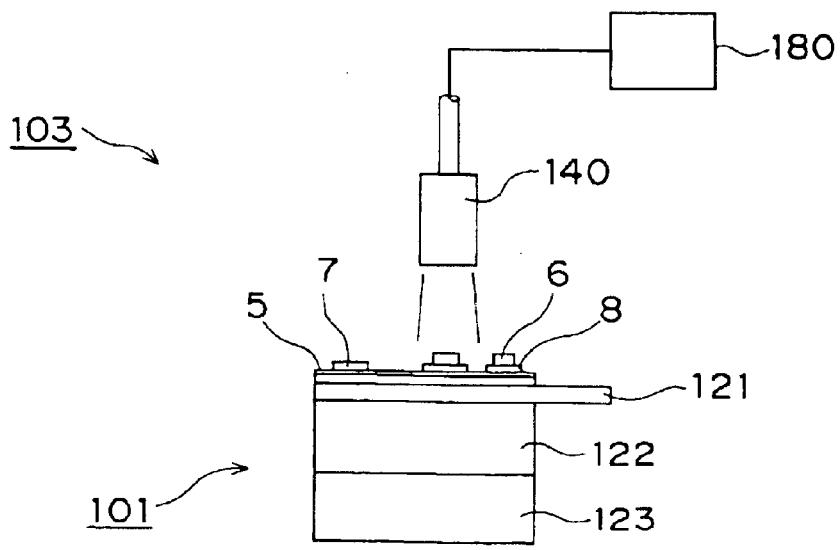
FIG. 9 is a diagram showing a different modified example of the bonder shown in FIG. 1.

When it is necessary to change a heating condition for a circuit board more locally, such an arrangement as a bonder 103 for an electronic component as shown in FIG. 9 is possible in which light beams, laser, hot air or the like is irradiated from above circuit board 5. In FIGS. 8 and 9 referred to above, power supply part 124, suction device 131 for the circuit board, suction device 132 for the stage member, cooling device 141 for the heater part, cooling device 142 for the base part, and controller 180 are omitted from the illustration because they can be construed as similar to that as shown in FIG. 1.

Second Embodiment

An electronic component mounting apparatus (described also as a "mounting system") including the bonder 101 will be depicted next. The foregoing FPC 5 is employed as an example of a circuit board.

Figure 11:
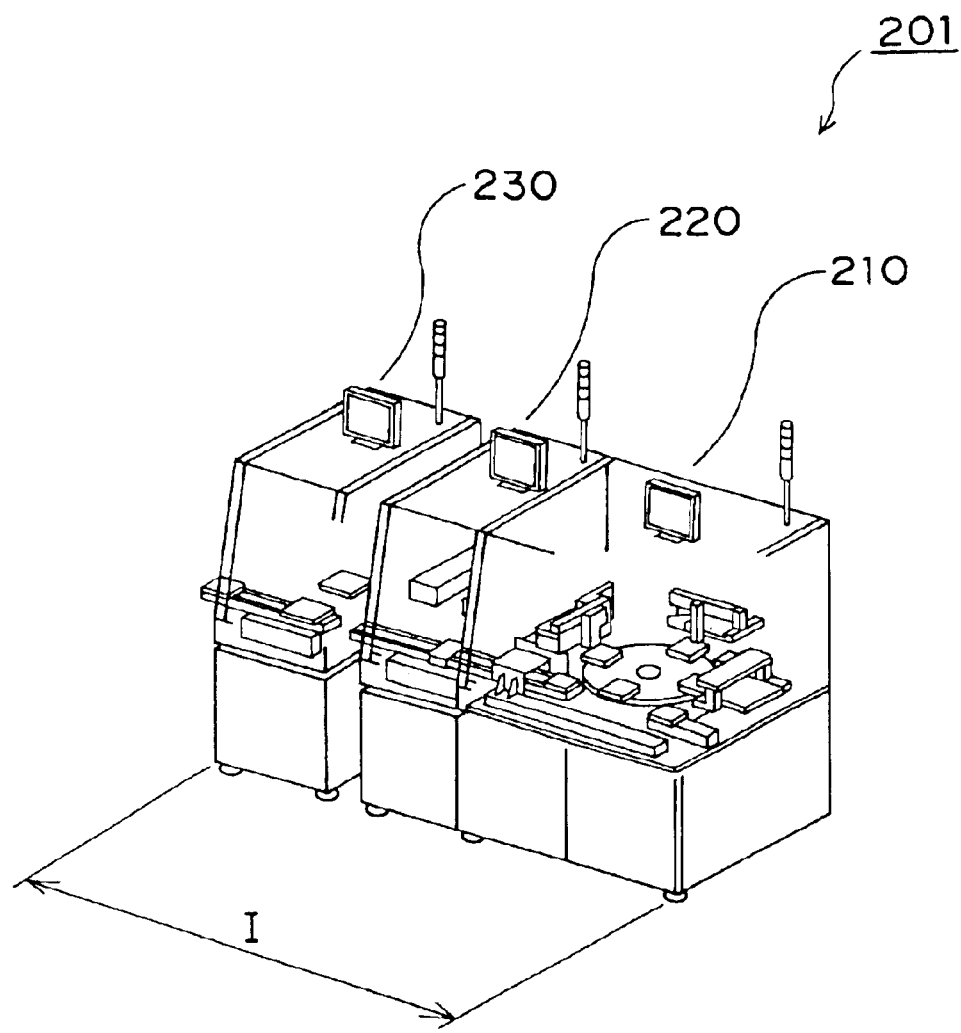
FIG. 11 is a perspective view of a mounting system constituted from the heating bonder shown in FIG. 10.

Mounting system 201 shown in FIG. 11 includes a solder supplying apparatus 210 for applying solder paste 8 to the FPC 5, a component setting apparatus 220 for mounting chip components 6 onto the FPC 5, and a heating bonder 230 having the bonder 101 for bonding chip components 6 to the FPC 5 by melting the solder paste 8. These are aligned so that the FPC 5 is transferred sequentially from the solder supplying apparatus 210 to the component setting apparatus 220 to the heating bonder 230. The FPC 5 having IC 7 mounted beforehand is supplied to the solder supplying apparatus 210. The solder supplying apparatus 210 may be constructed as either one of a solder printer and a solder dispenser.

As depicted in the foregoing description of the bonder 101, the bonder 101 is constituted to heat a circuit board by sucking the circuit board onto the stage member 110, and at the same time, the stage member 110 is made to correspond in size to that of the circuit board. Therefore, an area occupied by the heating bonder 230 is considerably small as compared with a conventional reflow apparatus. A total length I of the mounting system 201 can be kept to, e.g., approximately 2.5 m in this example.

The heating bonder 230 will be described with reference to FIG. 10.

The heating bonder 230 has a heating part 235 with bonders 101, a carry-in unit 231 for carrying the FPC 5 into the heating bonder 230 from the component setting apparatus 220 of a previous stage, a carry-out unit 233 for sending the FPC 5 out of the heating bonder 230 to a next process, a transfer unit 232 for transferring the FPC 5 from the carry-in unit 231 to the heating part 235 and from the heating part 235 to the carry-out unit 233, and a control unit (controller) 236 for controlling operation of these constituting parts.

The carry-in unit 231 has a carry-in stage 2312 which sucks and holds the FPC 5 and is reciprocated by a driving device 2311 in an X-direction as a transfer direction. Operation of the carry-in unit 231 is controlled by the controller 236. The carry-out unit 233 has a carry-out stage 2332 which sucks and holds the FPC 5 and is reciprocated by a driving device 2331 in the X-direction. Operation of the carry-out unit 233 is controlled by the controller 236.

The heating part 235 is constituted of two stages, a first stage 235-1 and a second stage 235-2. Each of the first stage 235-1 and the second stage 235-2 is constituted of two bonders 101, of FIG. 1, arranged in a longitudinal direction, i.e., a Y-direction as indicated in FIG. 10. Therefore, a total of four bonders 101 are used for the heating part 235, because one sheet of the FPC 5 to be treated by this mounting system 201 corresponds to a size of two stage members 110 of the bonder 101 arranged in the Y-direction. A specific size of the FPC 5 to be treated by the mounting system 201 is 35 mm×70 mm. A size of the above stages is not limited by the form of the mounting system 201 and can be determined in accordance with sizes of the circuit boards to be treated. Also, the number of the stages arranged at the heating part 235 is not limited to this example and can be one or more, which is determined on the basis of a throughput required for the mounting system.

Figure 10:
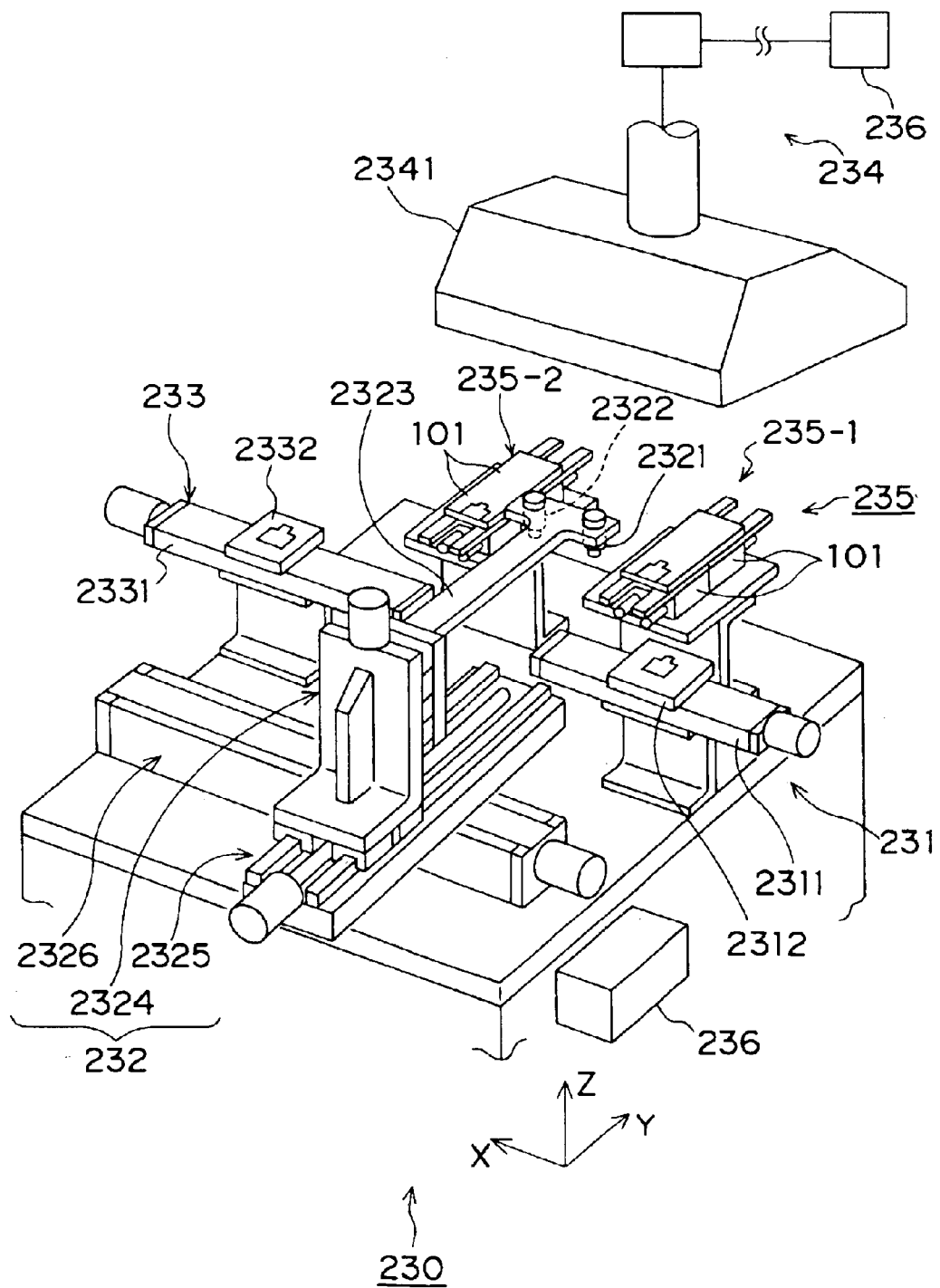
FIG. 10 is a perspective view of a heating bonder constituted from the bonder shown in FIG. 1.

In FIG. 10, power supply part 124, suction device 131 for the circuit board, suction device 132 for the stage member, cooling device 141 for the heater part and cooling device 142 for the base part provided for each of the bonders 101, which constitute the stages 235-1 and 235-2, are not illustrated because these parts can be construed as equal to those in FIG. 1, while the foregoing controller 180 is replaced with the controller 236. The same temperature control, as the above-described temperature control for the bonder 101 by the controller 180, is executed for each of the first stage 235-1 and the second stage 235-2 by controlling operation thereof by the controller 236.

The transfer unit 232 has a transfer suction device 2321 for transferring the FPC 5 to the first stage 235-1 and to the second stage 235-2 of the heating part 235 from the carry-in stage 2312 of the carry-in unit 231, a transfer suction device 2322 for transferring the FPC 5 to the carry-out stage 2332 of the carry-out unit 233 from the first stage 235-1 and the second stage 235-2, a Z-driving device 2324 for moving a transfer arm 2323 having the transfer suction device 2321 and the transfer suction device 2322 arranged thereon in a Z-direction which is a thickness direction of the FPC 5 and orthogonal to the X-direction and Y-direction, a Y-driving device 2325 for moving the Z-driving device 2324 in the Y-direction, and an X-driving device 2326 for moving the Y-driving device 2325 in the X-direction. A suction device omitted from the illustration is included in the transfer suction device 2321 and the transfer suction device 2322. The transfer unit 232 constituted as above is controlled to be operated by the controller 236.

Furthermore, the heating bonder 230 has a suction device 234 having a duct 2341 for sucking fumes generated from the FPC 5 being heated by the heating part 235.

Operation of the thus constituted mounting system 201, primarily operation at the heating bonder 230 will be described below.

A first FPC 5 transferred from the component setting apparatus 220 is supplied onto the carry-in stage 2312 of the carry-in unit 231 provided as part of the heating bonder 230. Each of the X-driving device 2326, the Y-driving device 2325, the Z-driving device 2324 and the transfer suction device 2321 provided as parts of the transfer unit 232 is driven, whereby the FPC is sucked and held by the transfer suction device 2321, placed on the first stage 235-1 of the heating part 235, and sucked and held. The FPC 5, while being retained on the first stage 235-1, is heated on the basis of a temperature profile by heating device 120, that is, is passed through a reflow operation. Fumes generated during this heating are sucked by the duct 2341 of the suction device 234.

A second FPC 5 carried next into the heating bonder 230 is treated similarly to the above first FPC 5. The second FPC 5 is supplied to the second stage 235-2 vacant at present, heated, and temperature controlled, when the first FPC 5 and chip components 6 are bonded to each other. A succeeding third FPC 5, which has been sucked by the transfer suction 231, is supplied to the first stage 235-1 and heated immediately after the first FPC 5 is completely heated at the first stage 235-1 and removed, by the transfer suction device 2322 of the transfer unit 232 to the carry-out stage 2332 of the carry-out unit 233, from the first stage 235-1.

The FPC 5 placed and sucked on the carry-out stage 2332 is held and carried out to a next process. The above operation is repeated, whereby the FPCs 5 are treated sequentially.

According to the mounting system 201 having the heating bonder 230, since the heating bonder 230 is constituted to be greatly compacted in comparison with the conventional art as described hereinabove, the mounting system 201 can be made compact as a whole as compared with the conventional art.

Figure 12:
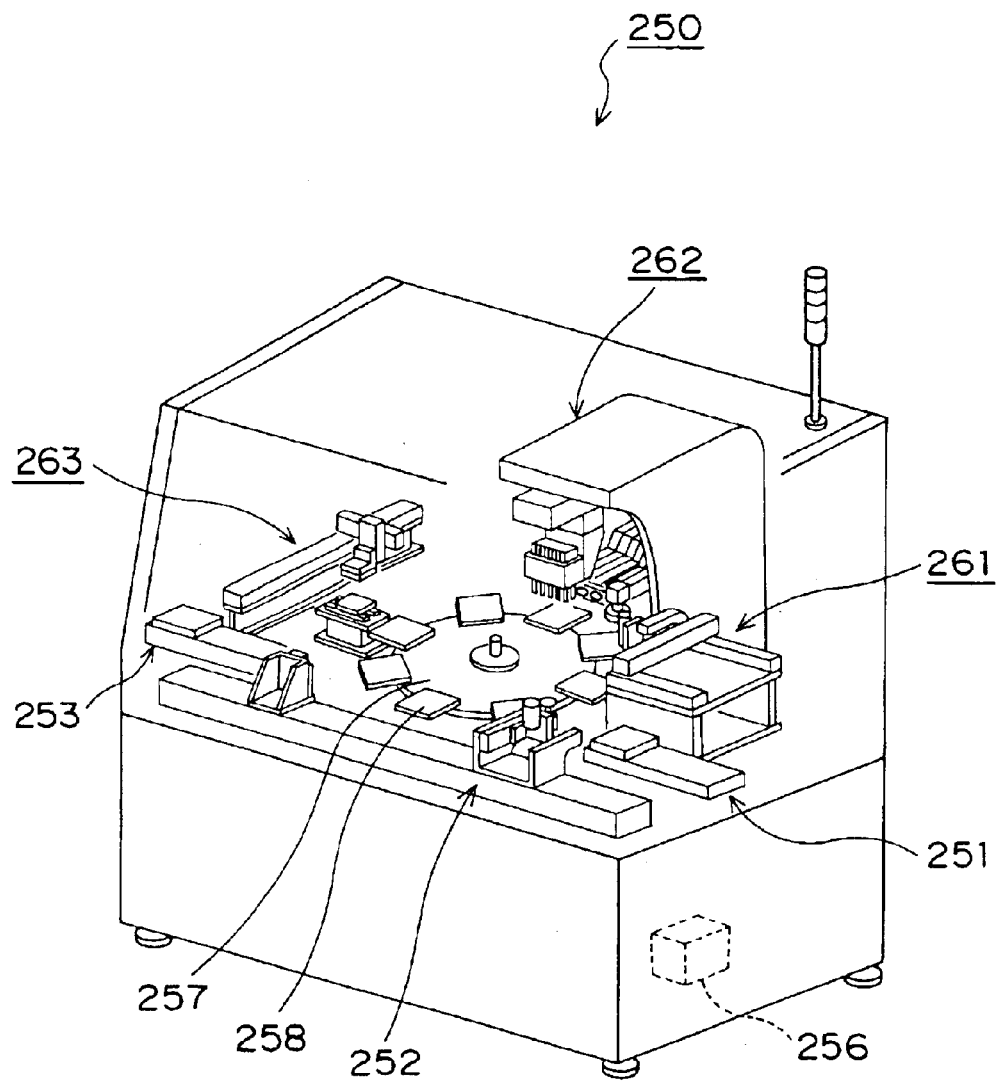
FIG. 12 is the mounting system constituted from the heating bonder shown in FIG. 10 in a different example.

Although the above mounting system 201 is constituted of the solder supplying apparatus 210, the component setting apparatus 220 and the heating bonder 230 arranged in an array along a transfer direction of circuit boards, namely, along the X-direction as shown in FIG. 11, an entire configuration of the mounting system is not limited to the above form, and it is possible to construct a mounting system 250 of a rotary type as shown in FIG. 12.

A circular rotary table 257, with working parts 258 arranged at constant intervals to a circumferential edge part, is installed to be intermittently rotatable relative to a central part of the mounting system 250. There are arranged surrounding the rotary table 257 and corresponding to stop positions of the working parts 258, a solder supplying apparatus 261 for supplying solder to a circuit board, a component setting apparatus 262 for mounting chip components 6 to the circuit board with the solder supplied thereto, and a heating bonder 263 having the above-described bonder 101 for heating the solder and bonding the chip components 6 to the circuit board. Moreover, a controller 256 is provided which is in charge of controlling operation of the mounting system 250 in its entirety. Also, there are provided a carry-in unit 251 for carrying in a circuit board from a previous process to the mounting system 250, a carry-out unit 253 for carrying out a circuit board from the mounting system 250 to a next process, and a transfer unit 252 for transferring circuit boards to the working parts 258. A suction device is also disposed for sucking fumes generated during heating of the circuit boards.

The mounting system 250 constituted as above operates in the following manner.

A circuit board is placed on a working part 258 by the transfer unit 252 via the carry-in unit 251, and is transferred to the solder supplying apparatus 261 by rotation of the rotary table 257. Solder is supplied to the circuit board at the solder supplying apparatus 261. The rotary table 257 rotates again, so that the circuit board is transferred to the component setting apparatus 262. At the component setting apparatus 262, chip components 6 are mounted onto the circuit board with the solder supplied thereto. The rotary table 257 rotates again and the circuit board is transferred to the heating bonder 263. The circuit board is heated and components are bonded to the circuit board at the heating bonder 263. The circuit board is transferred to the carry-out unit 253 by rotation of the rotary table 257 again, and moved by the transfer unit 252 to the carry-out unit 253. The carry-out unit 253 carries out the circuit board to a next process.

For instance, when a first circuit board is being heated by the heating bonder 263, components are mounted onto a second circuit board by the component setting apparatus 262 and solder is supplied to a third circuit board by the solder supplying apparatus 261. Different processes are thus carried out for a plurality of circuit boards, respectively.

A lateral width of the mounting system can be further reduced by adopting a form with the rotary table 257 as described above with regard to mounting system 250.

When there are eight stop positions arranged at the rotary table 257, a recognition camera for inspecting a supply state of solder to a circuit board, or a device for adding solder to a part where solder is not fully supplied, can be installed additionally between the solder supplying apparatus 261 and the component setting apparatus 262, and effectively utilized. The heating bonder 263 can be arranged within a working part 258, attached to the carry-out unit 253, or between the rotary table 257 and the carry-out unit 253.

Figure 13:
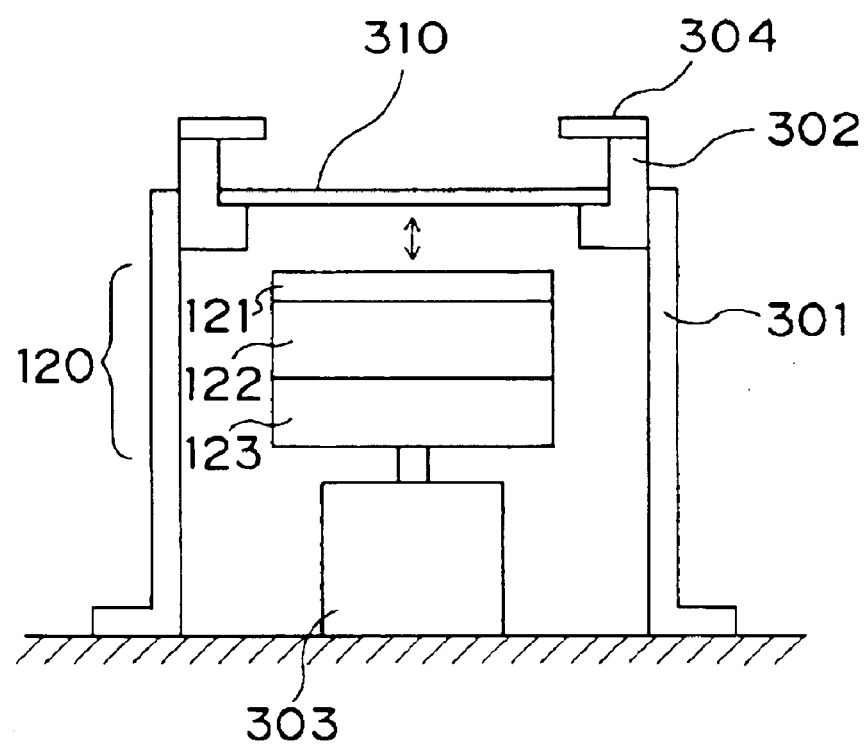
FIG. 13 is a diagram of a different example of a transfer unit for transferring circuit boards to the bonder shown in FIG. 1.

In each of the above-discussed embodiments, since the FPC 5 is employed as an example of the circuit board, a method of sucking and holding circuit boards is adopted for transferring the circuit board. However, in a case where the circuit board is a substrate which is, e.g., approximately 1 mm thick and resistant to deformation such as deflection and the like, such an arrangement as shown in FIG. 13 may be provided in which a circuit board 310 is transferred by transfer rails 302 supported by brackets 301. In this case, while heating bonder 120 is tightly adhered by an up-down driving part 303 to the circuit board 310, a retaining member 304 is preferably disposed on each transfer rail 302 for stabilizing this adhesion.

Third Embodiment

As is described hereinabove, in the bonder 101 used in each embodiment, the FPC 5 is sucked and held to the front face 110a of the stage member 110 by a suction operation performed by the suction device 131. A passage for suction passes through the heater part 121 to reach the suction device 131 as shown in FIG. 4. Therefore, there is a possibility that a part of fumes generated, when the FPC 5 sucked to the stage member 110 is heated and the solder paste 8 is melted, enters the heater part 121 due to the above suction. Moreover, there is a type of circuit board, among circuit boards to be sucked to the stage member 110, through which holes are formed penetrating the board along a thickness direction of the board. An amount of fumes passing the heater part 121 increases greatly in circuit boards having such through holes.

Entrance of fumes into the heater part 121 necessitates cleaning of the heater part 121, thereby forcing equipment to stop for cleaning work to be performed, which results in a decrease of productivity.

A bonder for an electronic component according to a third embodiment to be described below is an improved type of bonder 101 of the above first embodiment, which is intended for improving productivity by preventing effects of fumes. The mounting system 201 discussed in the second embodiment can adopt a configuration provided with a bonder of the following third embodiment in place of the bonder 101.

Figure 14:
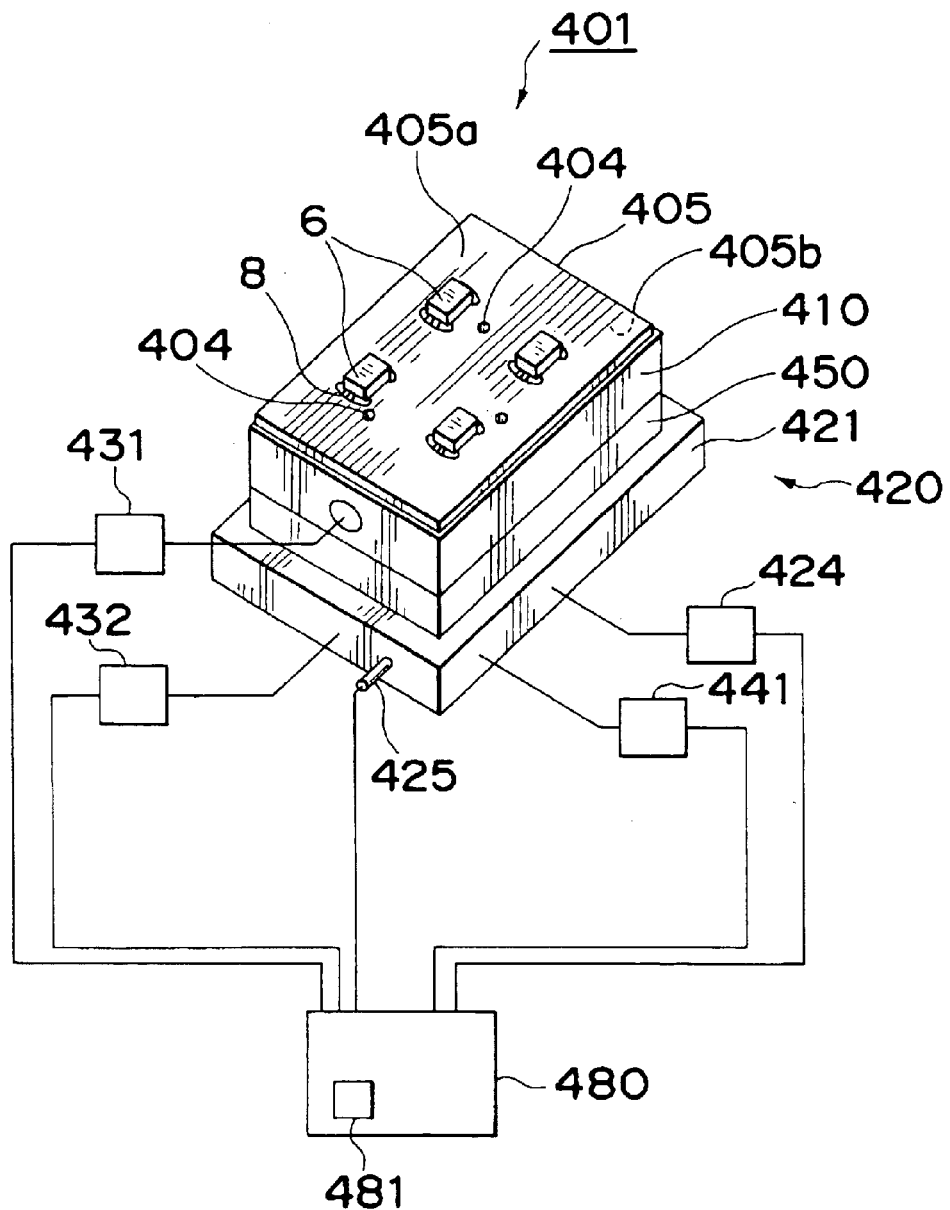
FIG. 14 is a perspective view of another embodiment of the bonder shown in FIG. 1.
Figure 16:
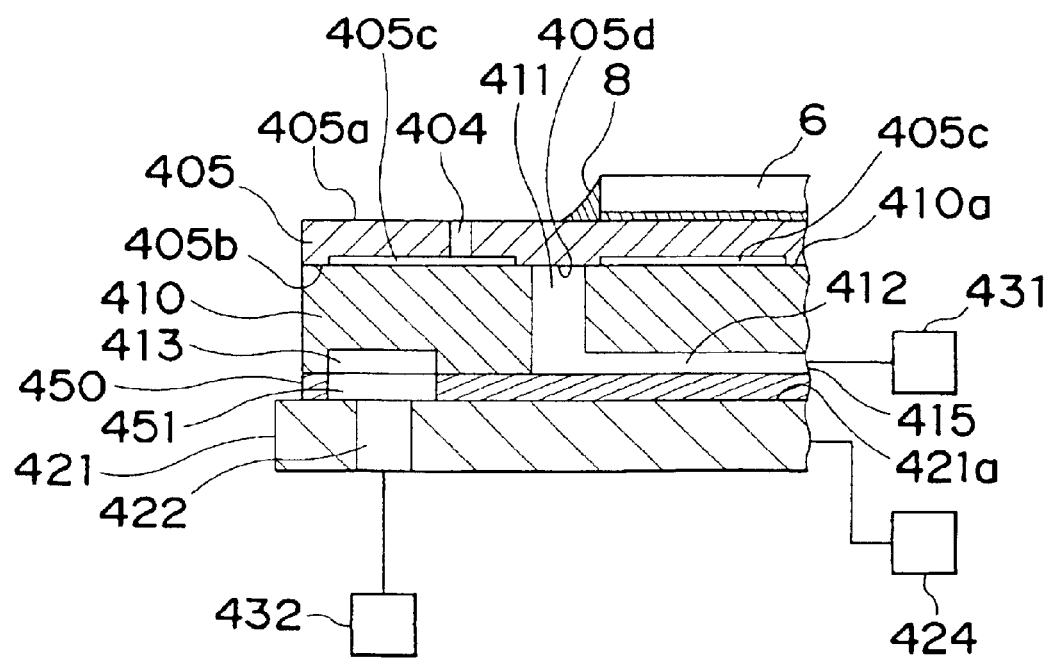
FIG. 16 is a sectional view of the bonder shown in FIG. 14.

A flexible substrate (FPC) 405 shown in FIG. 14 is a substrate for connecting, e.g., a liquid crystal module and a motherboard to each other, similar to the above-described FPC 5. The flexible substrate is a single-sided mounting substrate and has a plurality of electronic components 6 and an IC 7 placed on portions of an electronic component mounting face 405a of the FPC 405 where solder paste 8, not yet solidified, is applied. In this embodiment, a plurality of through holes 404 are formed penetrating the FPC 405 in a thickness direction of the FPC 405. A recessed part 405c with approximately a thickness of a wiring line, shown in FIG. 16, is formed at a part on a stage member contact face 405b of the FPC 405 opposite to the component mounting face 405a, i.e. the part corresponding to a part without a wiring line. The above through holes 404 are provided for a purpose of disconnecting an unnecessary wiring part, and therefore, the through holes 404 and the recessed part 405c are normally in a structure in which the holes and the recessed part are connected to each other.

As indicated in FIG. 14, bonder 401 for an electronic component in the third embodiment has a stage member 410 for receiving the FPC 405, and a heating device 420 for heating the stage member 410 and thereby heating the FPC 405 maintained in contact with the stage member 410, thereby melting the solder paste 8 for bonding components to the FPC 405. A member 450 for adhesion is preferably arranged between the stage member 410 and the heating device 420.

Figure 15:
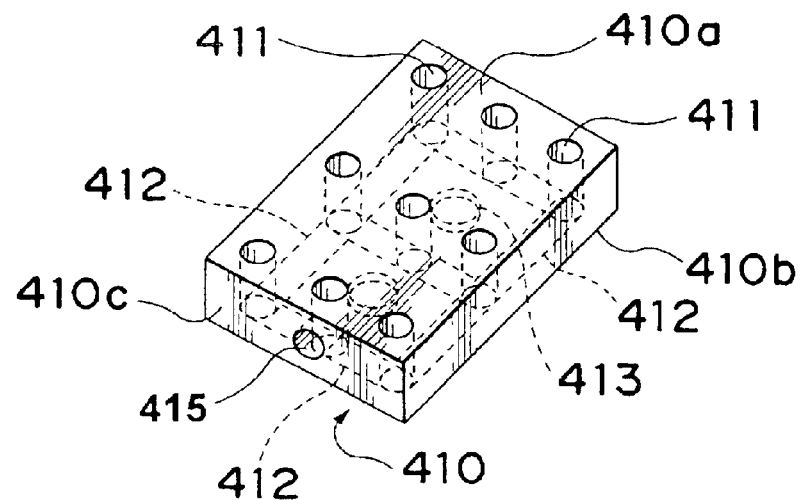
FIG. 15 is a perspective view of a stage member shown in FIG. 14.

The stage member 410 shown in FIG. 15 is a member corresponding to the earlier described stage member 110, having both a function of receiving and holding the FPC 405 and a function of transmitting heat to the FPC 405. The stage member 410 is easily replaceable so as to be able to meet various kinds of circuit boards. The stage member 410 is preferably formed of a material having a superior thermal conductivity such as aluminum, copper, magnesium, ceramic, or the like. Particularly, using an aluminum member having a thickness of approximately 3 mm is preferred because it is inexpensive and exerts soaking properties. In the present embodiment, the stage member 410 is formed of a 45 mm×80 mm rectangular plate material corresponding to a size of the FPC 405 to be treated.

Moreover, a plurality of substrate suction holes 411 for sucking and holding the FPC 405 are opened to a circuit board placing face 410a of the stage member 410 to which the stage member contact face 405b of the FPC 405 comes into contact. In the embodiment, as shown in FIG. 16, the substrate suction holes 411 are disposed at positions where the holes are prevented from communicating directly with the through holes 404 formed in the FPC 405. In addition, the substrate suction holes 411 are disposed at positions where the holes are prevented from connecting with recessed part 405c of the stage member contact face 405b of the FPC 405. So long as these arrangement conditions are satisfied, the number and arrangement position of the substrate suction holes 411 can be determined in accordance with a circuit board to be held. Therefore, the substrate suction holes 411 suck a suction region 405d, other than the recessed part 405c and the through holes 404, at the stage member contact face 405b. The suction region 405d is normally a flat face but can be dented.

The substrate suction holes 411 are connected with each other via substrate suction grooves 412 formed in an adhesion member contact face 410b of the stage member 410, and each substrate suction groove 412 is connected to an opening 415 for suction formed in a side face 410c of the stage member 410. The opening 415 for suction is connected directly to a suction device 431 for the circuit board. Therefore, the FPC 405 placed on the substrate placing face 410a of the stage member 410 is sucked and held to the substrate placing face 410a by a suction operation performed by the suction device 431. Although fumes generated from solder paste 8, when components 6 are bonded, possibly enter the substrate suction holes 411 and the substrate suction grooves 412 through the through holes 404, the fumes are sucked via the opening 415 by the suction device 431. The fumes are accordingly prevented from passing the heating device in the third embodiment.

Since the through holes 404 and the substrate suction holes 411 are not directly connected with each other, and since the substrate suction holes 411 suck the suction region 405d as described above, a holding force for holding the FPC 405 to the substrate placing face 410a via the substrate suction holes 411 is large, and holding accuracy can be improved. Moreover, since the FPC 405 is held to the substrate placing face 410a through local suction via the substrate suction holes 411, an amount of air leaked can be reduced in comparison with a case of sucking through suction holes arranged, e.g., like slots in the substrate placing face 410a. Holding accuracy for the FPC 405 to the substrate placing face 410a is improved also from this point of view.

In the adhesion member contact face 410b of the stage member 410 are disposed suction grooves 413, for the stage member, separately from the substrate suction grooves 412 to adhere and hold the stage member 410 to the heater part 421 via member for adhesion 450. The suction grooves 413 for the stage member are circular recesses in the present embodiment as illustrated, each having a diameter larger than a diameter of a passage 422, for sucking the stage member, which is formed in a heater part 422 to be described later.

Figure 17:
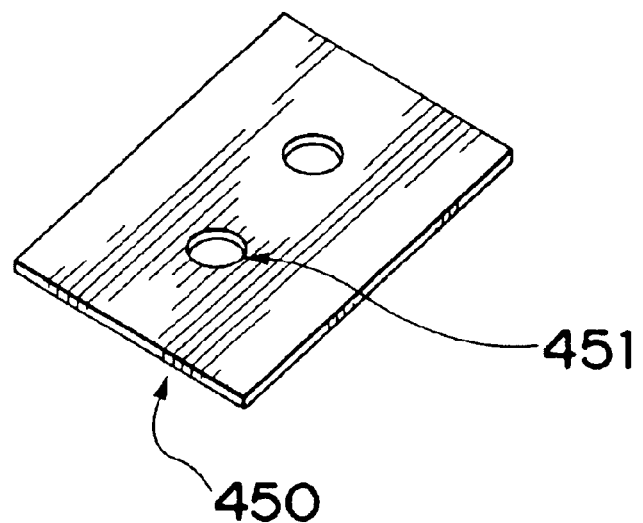
FIG. 17 is a perspective view of a member for adhesion shown in FIG. 14.

As shown in FIG. 17, the member 450 for adhesion is a sheet-like member having both a function of blocking contamination of the stage member 410 from reaching the heater part 421 and a function of transmitting heat to the stage member 410, and is constituted to be easily replaceable to improve maintenance efficiency. The member 450 for adhesion is preferably formed of a material having a good thermal conductivity such as aluminum, copper, magnesium, ceramic, or the like. It is preferable to use particularly an aluminum material having a thickness of approximately 0.05 mm because it is inexpensive and soaking properties can be obtained. In the embodiment, the member 450 for adhesion is made of a 45 mm×80 mm rectangle corresponding to a size of the FPC 405 to be treated. As indicated in the drawing, there are formed in the member 450 for adhesion, stage member suction holes 451 penetrating in a thickness direction of the member 450 for adhesion at the same position and being of the same shape as the suction grooves 413 for the stage member, which are present in the adhesion member contact face 410b of the stage member 410. A space for suction is constituted by the suction grooves 413 and the suction holes 451.

By providing the above member 450 for adhesion, adhesion between the stage member 410 and the heater part 421 described below is improved, and at the same time, the substrate suction grooves 412 of the stage member 410 are prevented from directly coming into contact with the heater part 421, so that fumes can be prevented from adhering to the heater part 421.

Figure 18:
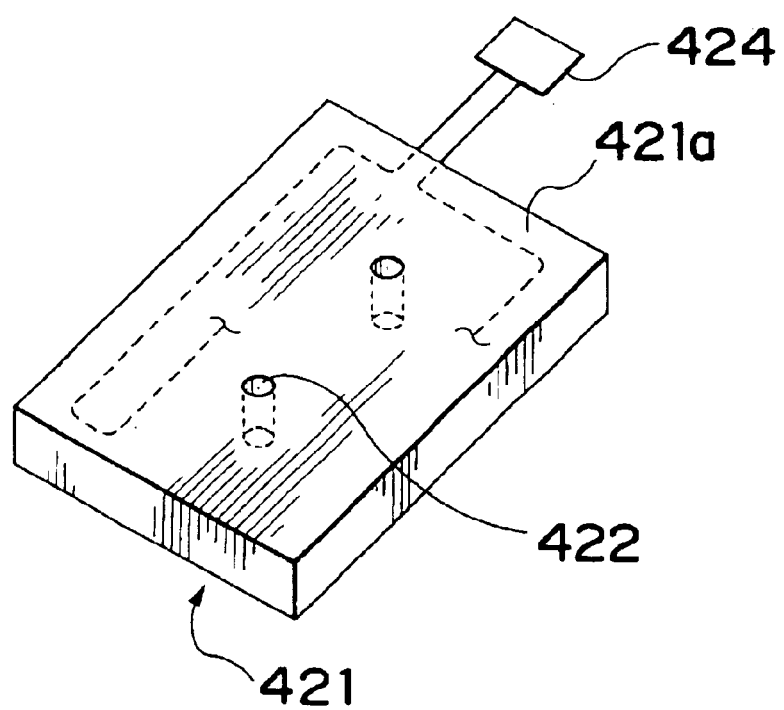
FIG. 18 is a perspective view of a heater part shown in FIG. 14.
Figure 19:
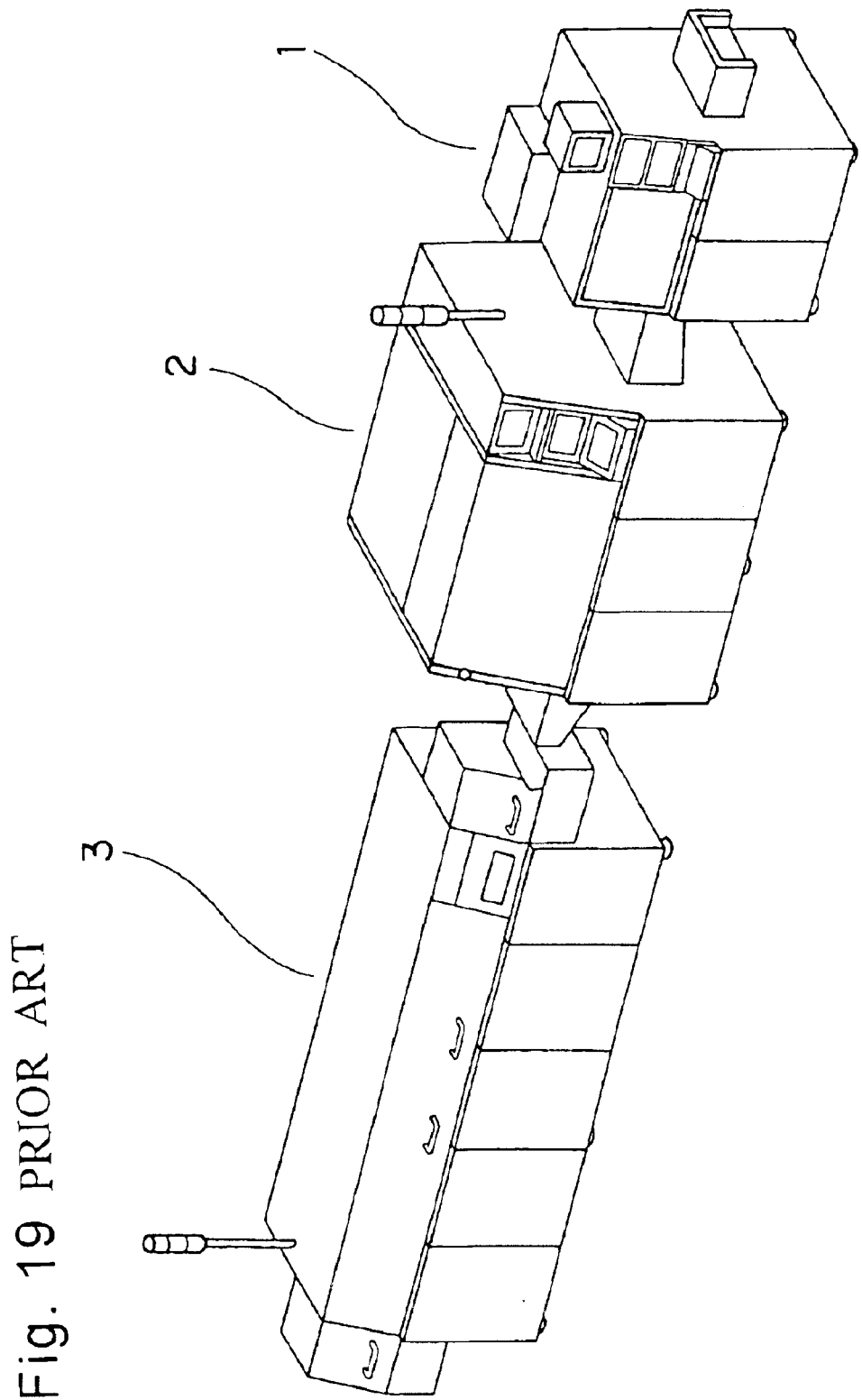
FIG. 19 is a perspective view of a conventional component mounting system.
Figure 20:
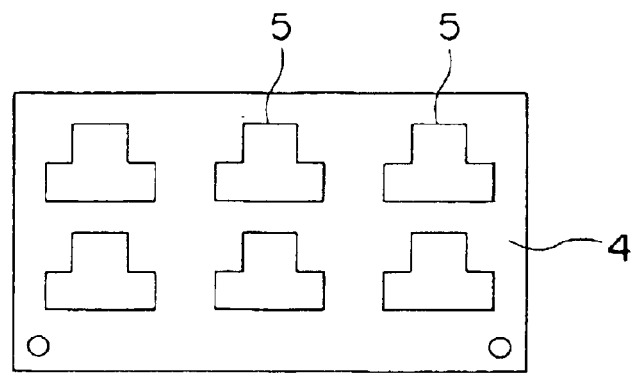
FIG. 20 is a diagram showing a state in which FPCs are arranged on a pallet when the FPCs are to be treated by a conventional reflow apparatus.
Figure 21:
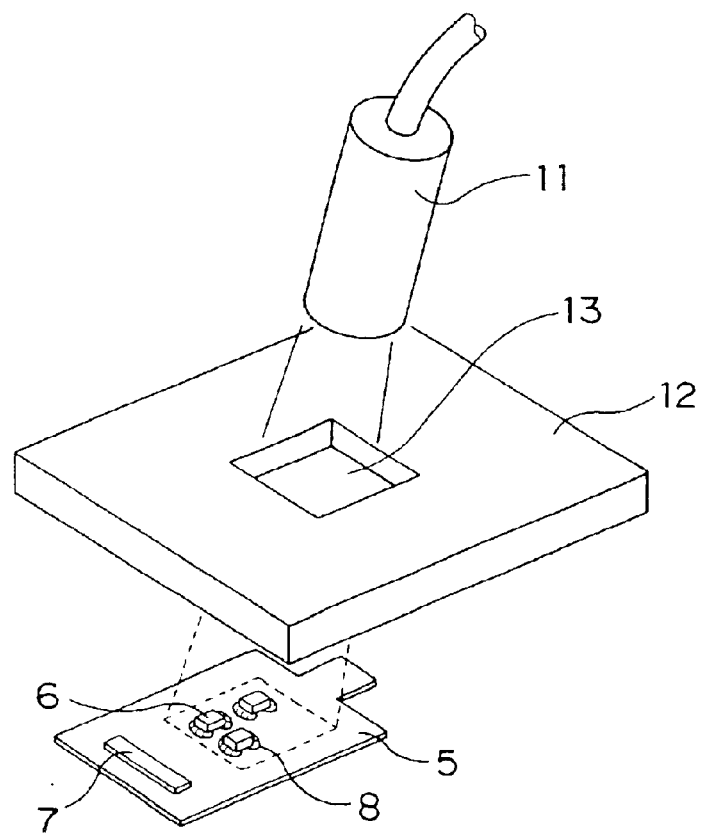
FIG. 21 is a perspective view showing an apparatus arrangement in a case of heating only a local region of a circuit board in the conventional art.

The heater part 421 shown in FIG. 18 is comprised of a ceramic heater having a superior responsiveness to a temperature rise/drop, which is designed to be heated when a current is supplied to a heater wire from a power supply part 424. The heating device 420 is constituted of the above heater part 421 and power supply part 424. In the present embodiment, the heater part 421 is preferably formed, in a thickness of approximately 0.5 mm to 5 mm, of a material having superior soaking properties and thermal conductivity such as a silicon nitride ceramic, cordierite, aluminum nitride ceramic or the like. Particularly, a silicon nitride ceramic material having a thickness of approximately 2 mm is used, because it is preferable since the heater part is made inexpensive and can exert soaking properties. The heater part 421 in the embodiment is rendered as a 55 mm×90 mm rectangle corresponding to a size of the FPC 405 to be treated. Further, the heater part 421 has passages 422, for sucking the stage member, formed at a position corresponding to the stage member suction holes 451 of the member 450. The passages 422 penetrate the heater part 421 in a thickness direction of the heater part 421. A suction device 432 for the stage member is connected to the passages 422. Therefore, air of the passages 422, the suction holes 451 and the suction grooves 413 is sucked by activating the suction device 432, whereby the stage member 410 is adhered and sucked to a placing face 421a of the heater part 421 via the member 450.

Although the passages 422 for sucking the stage member are cylindrical passages in the embodiment, a diameter of each passage is made small in comparison with the above suction holes 413 for the stage member, and the stage member suction holes 451. By so constituting as above, a space for suction, that is, the suction grooves 413 for the stage member can be secured larger at the stage member 410 with respect to the passages 422, and a holding force for holding the stage member 410 to the heater part 421 can be improved.

A temperature of the heater part 421 is measured by a temperature sensor, for example, by a thermocouple 425 installed in the heater part 421, and sent out to the controller 480. The power supply part 424 is connected to controller 480, and the controller 480 feedback controls the temperature of the heater part 421 on the basis of temperature information supplied from the thermocouple 425 and a temperature profile preliminarily set for controlling a temperature of a circuit board. A cooling device 441 for the heater part is connected to the heater part 421 so that the heater part 421 can be forcibly cooled to execute a temperature control conforming to the temperature profile. The cooling device 441 for the heater part supplies a gas, e.g., air to the heater part 421, thereby forcibly cooling the heater part 121 in the present embodiment.

The controller 480 is connected to the above suction device 431 for the circuit board, the suction device 432 for the stage member, the power supply part 424 and the cooling device 441 for the heater part, thereby controlling operation of each of these parts according to a program stored in a storage part 481.

With respect to the bonder 401 constituted as described hereinabove, operation of the bonder, i.e., an electronic component bonding method will be described below. The bonder 401 is particularly effective for heating and holding thin circuit boards, similar to the earlier described bonder 101, and is suitable for substrates having a thickness of not larger than 1 mm as a guideline.

The member 450 for adhesion is placed on the placing face 421a of the heater part 421 while the stage member suction holes 451 of the member 450 for adhesion are made to correspond to the passages 422 of the heater part 421. Moreover, the stage member 410 is placed on the member 450 while the suction grooves 413 of the stage member 410 are made to correspond to the stage member suction holes 451. The suction device 432 for the stage member is activated to adhere and hold the stage member 410, via the member 450, to the placing face 421a of the heater part 421 by performing a suction operation. Then, after the suction device 431 for the circuit board is activated, the FPC 405 is placed onto the circuit board placing face 410a of the stage member 410, and the FPC 405 is adhered and fixed to the circuit board placing face 410a via the substrate suction holes 411 and the suction grooves 412 of the stage member 410.

A heating operation performed by the heater part 421 is controlled by the controller 480 in accordance with the above-referred temperature profile. The solder paste 8 is melted by the heating operation, and electronic components 6 are bonded onto the FPC 405.

At this time, fumes generated from the solder paste 8 are sometimes sucked through the through holes 404 of the FPC 405. However, the sucked fumes are discharged through the substrate suction holes 411 and the suction grooves 412 of the stage member 110, and are therefore prevented from contaminating the heater part 421. According to the bonder 401 of the third embodiment as above, cleaning the heater part 421 is eliminated and a high productivity can be achieved without stopping equipment for performing cleaning work.

After the components 6 are completely bonded to the FPC 405 in the manner as described above, operation of the suction device 431 is stopped to stop the suction, and the FPC 405 is removed from the stage member 410.

Similar to the earlier discussed case of the bonder 101, in the bonder 401, the stage member 410 has a size nearly equal to or slightly larger than the size of the FPC 405 so that one FPC 405 can be placed onto the circuit board placing face 410a of the stage member 410. However, the size of the circuit board relative to the stage member 410 is not limited to the example of this embodiment, and for instance, a plurality of bonders 401 may be arranged as is described with reference to FIG. 8 so as to place one circuit board on a plurality of stage members 410.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A bonding apparatus for an electronic component, comprising:
    a stage member for having placed thereon a circuit board to which an electronic component is to be mounted;
    a heating device for heating said stage member so as to heat the circuit board when held in contact with said stage member, and melt a bonding material that is to bond the electronic component to the circuit board; and
    a suction device connected to said stage member for sucking and holding the circuit board to said stage member,
    wherein when a rear face of said stage member is in contact with said heating device, said rear face of said stage member and said heating device define a space for suction so as to enable said stage member to be sucked by said suction device.

2. The bonding apparatus according to claim 1, wherein said heating device includes a ceramic heater and is to heat the circuit board by changing a heating temperature with respect to a heating time.

3. The bonding apparatus according to claim 2, further comprising:
    a cooling device, connected to said heating device, for cooling the circuit board.

4. The bonding apparatus according to claim 1, wherein the circuit board has a thickness of at most 1 mm.

5. The bonding apparatus according to claim 1, wherein the circuit board is film-shaped.

6. The bonding apparatus according to claim 1, wherein said stage member has a hole in fluid communication with said suction device, with said suction device being for sucking and holding the circuit board to said stage member via said hole.

7. A bonding apparatus for an electronic component, comprising:
    a stage member for having placed thereon a circuit board to which an electronic component is to be mounted;
    a heating device for heating said stage member so as to heat the circuit board, when held in contact with said stage member, and melt a bonding material that is to bond the electronic component to the circuit board;
    a first suction device connected to said stage member for sucking and holding the circuit board to said stage member;
    a member for adhesion to be held between said stage member and said heating device for tightly adhering said stage member to said heating device; and
    a second suction device connected to said heating device for sucking and holding said stage member to said heating device via said member for adhesion,
    wherein said stage member has an opening which directly interconnects said first suction device and said stage member.

8. The bonding apparatus according to claim 7, wherein when an adhesion member contact face of said stage member is held in contact with said member for adhesion, said adhesion member contact face and said member for adhesion define a space for suction so as to enable said stage member to be sucked by said second suction device.

9. The bonding apparatus according to claim 7, wherein said heating device includes a ceramic heater and is to heat the circuit board by changing a heating temperature with respect to a heating time.

10. The bonding apparatus according to claim 9, further comprising:
    a cooling device, connected to said heating device, for cooling the circuit board.

11. The bonding apparatus according to claim 7, wherein the circuit board has a thickness of at most 1 mm.

12. The bonding apparatus according to claim 7, wherein the circuit board is film-shaped.

13. The bonding apparatus according to claim 7, wherein said stage member has a hole in fluid communication with said opening, with said first suction device being for sucking and holding the circuit board to said stage member via said opening and said hole.

14. A bonding apparatus for an electronic component, comprising:
    stage members for having placed thereon a circuit board to which an electronic component is to be mounted;
    heating devices for heating said stage members, respectively, so as to heat the circuit board when held in contact with said stage members, and melt a bonding material that is to bond the electronic component to the circuit board; and
    a suction device connected to said stage members for sucking and holding the circuit board to said stage members,
    wherein when rear faces of said stage members are in contact with said heating devices, respectively, said rear faces of said stage members and said heating devices define spaces for suction, respectively, so as to enable said stage members to be sucked by said suction device.

15. The bonding apparatus according to claim 14, wherein said heating devices include ceramic heaters, respectively, and are to heat the circuit board by changing a heating temperature with respect to a heating time.

16. The bonding apparatus according to claim 15, further comprising:
    cooling devices connected to said heating devices, respectively, for cooling the circuit board.

17. The bonding apparatus according to claim 14, wherein the circuit board has a thickness of at most 1 mm.

18. The bonding apparatus according to claim 14, wherein the circuit board is film-shaped.

19. The bonding apparatus according to claim 14, wherein said stage members have holes, respectively, in fluid communication with said suction device, with said suction device being for sucking and holding the circuit board to said stage members via said holes.

20. A bonding apparatus for an electronic component, comprising:

stage members for having placed thereon a circuit board to which an electronic component is to be mounted;

heating devices for heating said stage members, respectively, so as to heat the circuit board when held in contact with said stage members, and melt a bonding material that is to bond the electronic component to the circuit board;

a first suction device connected to said stage members for sucking and holding the circuit board to said stage members;

members for adhesion to be held between said stage members and said heating devices, respectively, for tightly adhering said stage members to said heating devices, respectively; and a second suction device connected to said heating devices for sucking and holding said stage members to said heating devices via said members for adhesion, respectively, wherein each of said stage members has an opening which directly interconnects said first suction device and said each of said stage members.

21. The bonding apparatus according to claim 20, wherein when adhesion member contact faces of said stage members are held in contact with said members for adhesion, respectively, said adhesion member contact faces and said members for adhesion define spaces for suction, respectively, so as to enable said stage members to be sucked by said second suction device.

22. The bonding apparatus according to claim 20, wherein said heating devices include ceramic heaters, respectively, and are to heat the circuit board by changing a heating temperature with respect to a heating time.

23. The bonding apparatus according to claim 22, further comprising:

cooling devices connected to said heating devices, respectively, for cooling the circuit board.

24. The bonding apparatus according to claim 20, wherein the circuit board has a thickness of at most 1 mm.

25. The bonding apparatus according to claim 20, wherein the circuit board is film-shaped.

26. The bonding apparatus according to claim 20, wherein said stage members have holes in fluid communication with said openings, respectively, with said first suction device being for sucking and holding the circuit board to said stage members via said openings and said holes.

* * * * *